(12) United States Patent
Ramsay et al.

(10) Patent No.: US 10,061,875 B2
(45) Date of Patent: Aug. 28, 2018

(54) RELATIVE PERMEABILITY INVERSION FROM HISTORICAL PRODUCTION DATA USING VISCOSITY RATIO INVARIANT STEP-FUNCTION RELATIVE PERMEABILITY APPROXIMATIONS

(71) Applicant: Landmark Graphics Corporation, Houston, TX (US)

(72) Inventors: Travis St. George Ramsay, Rosenberg, TX (US); Trace Boone Smith, Lafayette, LA (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 162 days.

(21) Appl. No.: 14/894,324

(22) PCT Filed: Sep. 16, 2013

(86) PCT No.: PCT/US2013/059982
§ 371 (c)(1),
(2) Date: Nov. 25, 2015

(87) PCT Pub. No.: WO2015/038161
PCT Pub. Date: Mar. 19, 2015

(65) Prior Publication Data
US 2016/0196369 A1 Jul. 7, 2016

(51) Int. Cl.
*G06F 17/50* (2006.01)
*G01V 11/00* (2006.01)
(Continued)

(52) U.S. Cl.
CPC .......... *G06F 17/5009* (2013.01); *E21B 43/00* (2013.01); *E21B 49/00* (2013.01);
(Continued)

(58) Field of Classification Search
CPC ...... G06F 17/5009; G01V 9/00; G01V 11/00; E21B 43/00; E21B 49/00
See application file for complete search history.

(56) References Cited

U.S. PATENT DOCUMENTS 8,131,526 B2 * 3/2012 Neville .................. E21B 49/00
703/10
9,790,770 B2 * 10/2017 King ...................... E21B 43/00
(Continued)

FOREIGN PATENT DOCUMENTS

WO WO2015038163 A1 3/2015

OTHER PUBLICATIONS

International Search Report and Written Opinion, dated Jun. 19, 2014, 10 pages, Korean International Searching Authority.

*Primary Examiner* — Nicholas Tobergte

(57) ABSTRACT

The disclosed embodiments include a method, apparatus, and computer program product for approximating multi-phase flow reservoir production simulation. For example, one disclosed embodiment includes a system that includes at least one processor and memory coupled to the at least one processor, the memory storing instructions that when executed by the at least one processor performs operations that includes generating a set of pseudo-phase production relative permeability curves; receiving production rate history data; receiving simulation configuration parameters; performing flow simulation using the set of pseudo-phase production relative permeability curves; determining an optimal matching pseudo-phase production simulation result that best matches the production rate history data; and performing relative permeability inversion using signal processing analysis of production rate history data to approximate relative permeability curve descriptions with quantified uncertainty.

20 Claims, 14 Drawing Sheets

(51) Int. Cl.
 *E21B 49/00* (2006.01)
 *G01V 9/00* (2006.01)
 *E21B 43/00* (2006.01)
(52) U.S. Cl.
 CPC ................ *G01V 9/00* (2013.01); *G01V 11/00* (2013.01); *G01V 2210/6246* (2013.01)

(56) References Cited

U.S. PATENT DOCUMENTS

| | | |
|---|---|---|
| 2007/0005253 A1 | 1/2007 | Fornel et al. |
| 2010/0071897 A1 | 3/2010 | Liu et al. |
| 2010/0185393 A1 | 7/2010 | Liang et al. |
| 2012/0253770 A1 | 10/2012 | Stern et al. |
| 2013/0096899 A1 | 4/2013 | Usadi et al. |
| 2015/0073762 A1* | 3/2015 | Patacchini .............. E21B 43/16 703/10 |
| 2015/0120255 A1* | 4/2015 | King ....................... E21B 43/00 703/2 |
| 2016/0177681 A1* | 6/2016 | Smith ..................... E21B 49/00 703/10 |

* cited by examiner

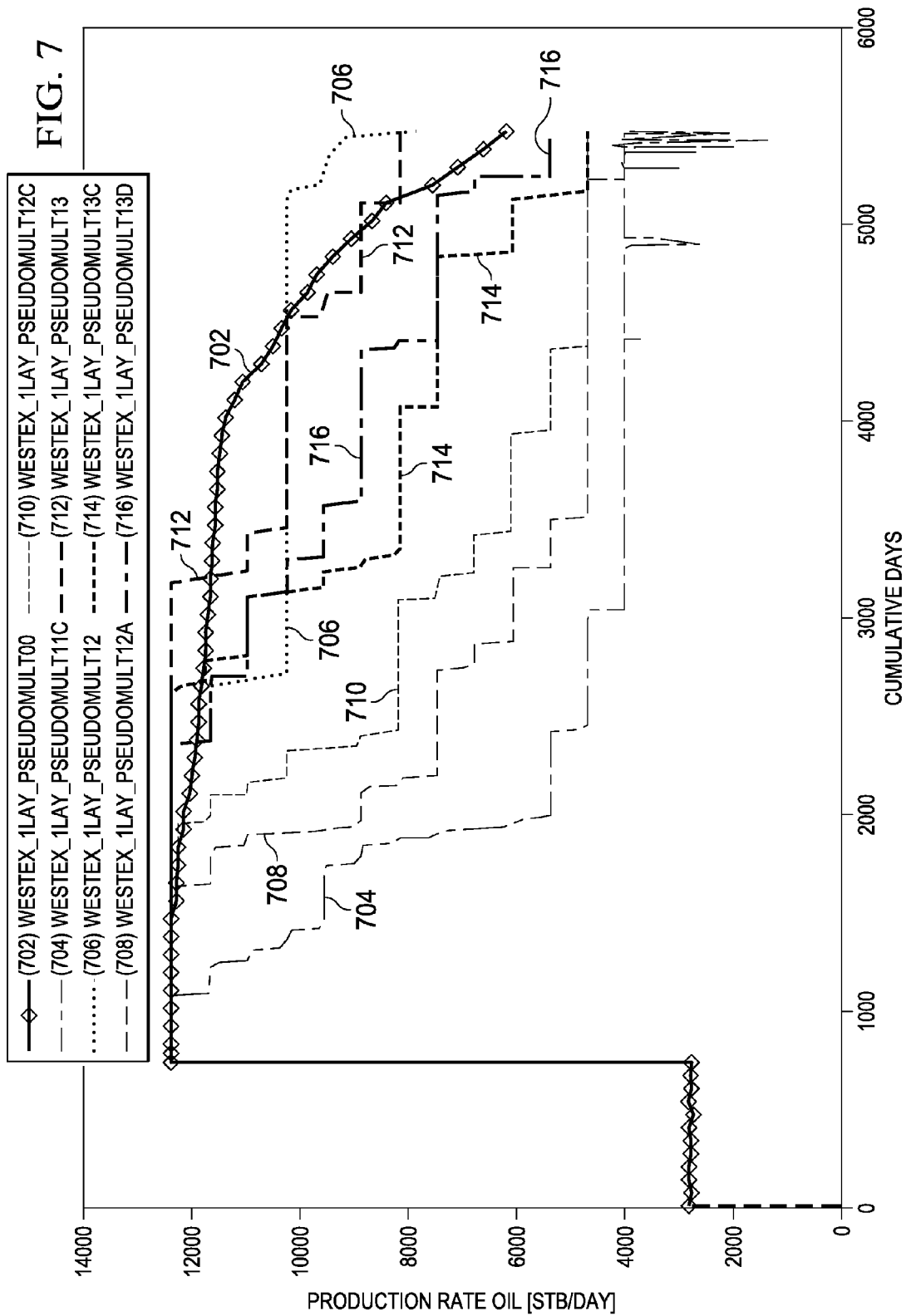

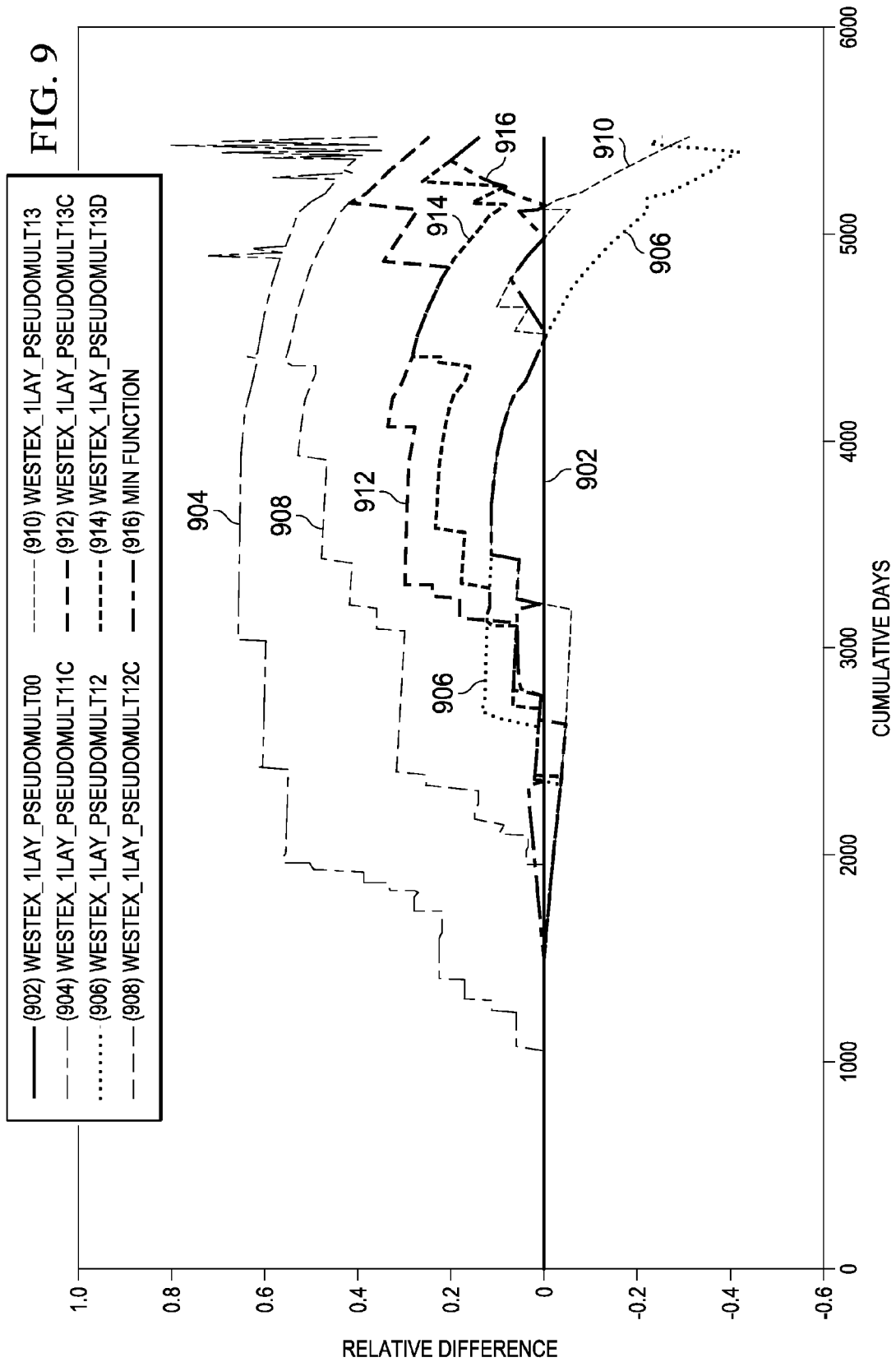

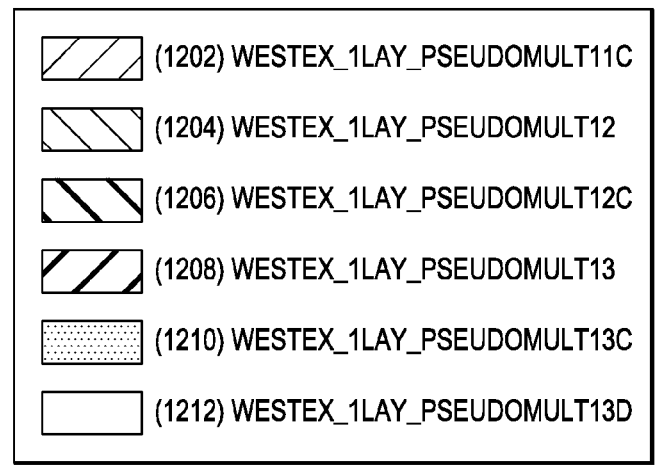
FIG. 11
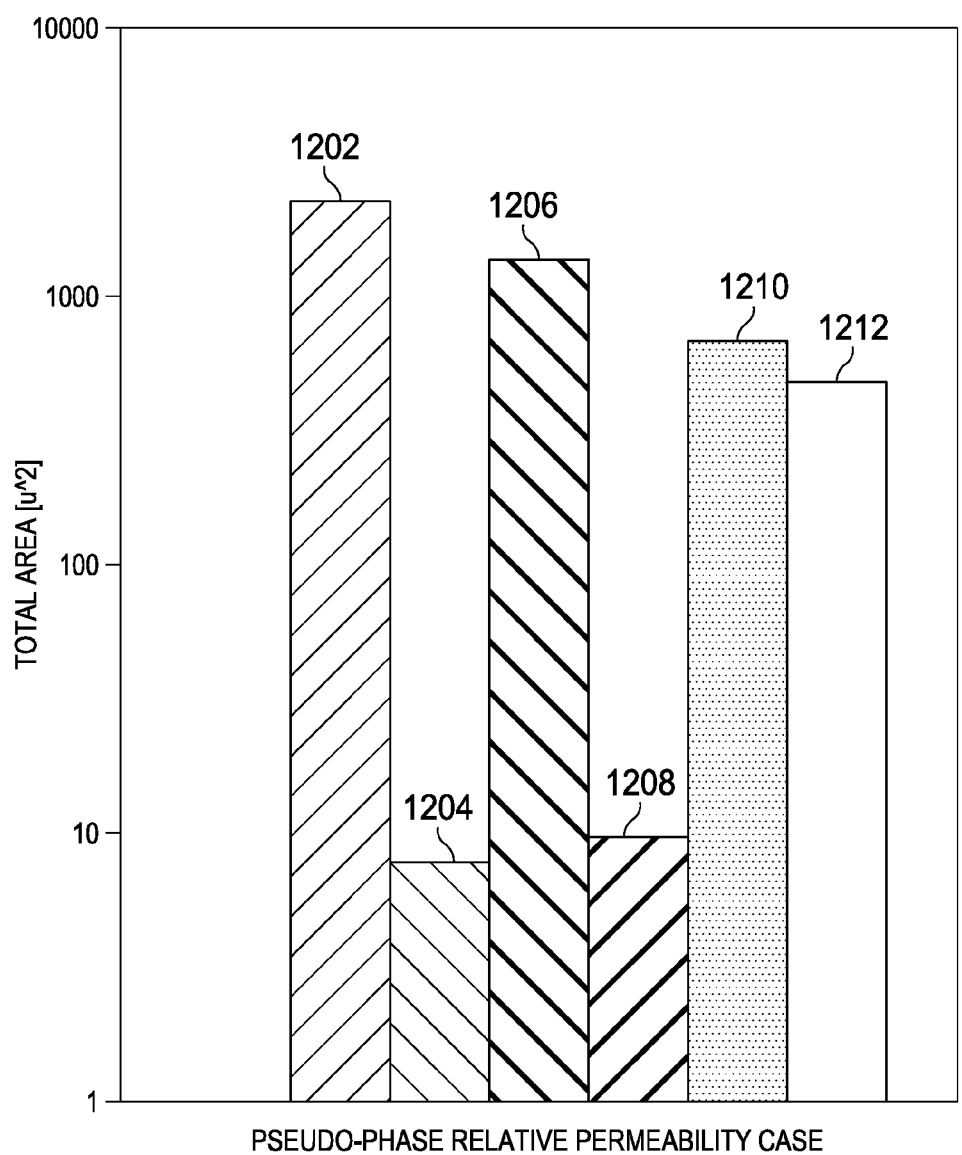

RELATIVE PERMEABILITY INVERSION FROM HISTORICAL PRODUCTION DATA USING VISCOSITY RATIO INVARIANT STEP-FUNCTION RELATIVE PERMEABILITY APPROXIMATIONS

CROSS-REFERENCE TO RELATED APPLICATIONS

This application is a U.S. National Stage patent application of International Patent Application No. PCT/US2013/059982, filed on Sep. 16, 2013, the benefit of which is claimed and the disclosure of which is incorporated herein by reference in its entirety.

BACKGROUND OF THE INVENTION

1. Field of the Invention

The present invention generally relates to the field of computerized reservoir modeling, and more particularly, to a system and method configured to approximate multiphase flow simulation using one or more pseudo-phase single flow relative permeability curves.

2. Discussion of the Related Art

Reservoir modeling and numerical simulation involving multiphase flows (i.e., flows where more than two phases (e.g., water and oil) are present) through a porous medium poses far greater challenges than that of single-phase flows due in part to interfaces between phases. Due to the overall complexity of multiphase flow simulation, the time needed to simulate multiphase flows are substantially greater than its single phase counterpart. In addition, simulation of multiphase flows requires a greater understanding of fluid property characteristics to accurately model the complex fluid system.

Accordingly, the disclosed embodiments seek to provide one or more solutions for one or more of the above problems associated with reservoir modeling involving multiphase flows.

BRIEF DESCRIPTION OF THE DRAWINGS

Illustrative embodiments of the present invention are described in detail below with reference to the attached drawing Figures, which are incorporated by reference herein and wherein:

FIG. 7 is a graph that depicts an example of a historical oil production rate curve shown relative to time-interpolated oil production rate plots resulting from disparate pseudo-phase simulation runs in accordance with the disclosed embodiments;

FIG. 9 is a graph that depicts an example of the relative difference between individual pseudo-phase production oil rate results with respect to historical simulation data in accordance with the disclosed embodiments;

FIG. 11 is a graph that depicts an example of the cumulative error in pseudo-phase production oil rates relative to historical data over the entire simulated time in accordance with the disclosed embodiments;

DETAILED DESCRIPTION

The disclosed embodiments include a system, computer program product, and a computer implemented method configured to perform a pseudo-phase production simulation. Pseudo-phase as referenced herein means approximating two or more phase (i.e., multiphase) flow using a single phase flow. A purpose of pseudo-phase production simulation is to extend the application of single phase flow simulation as an efficient means of predicting actual multiphase reservoir production. Additionally, the disclosed embodiments seek to treat relative permeability curves, which are input into a reservoir simulator to describe fluid-fluid and fluid-rock interaction, as a synthesized signal to approximate different flow regimes which may exist during production; then use this approximation to validate a given static model with respect to production history.

A primary advantage of the disclosed embodiments is the determination of hydraulic conductivity for the different flow regimes that comprise the reservoir once they are associated with an active production scenario. Another advantage of the disclosed embodiments is that it would diminish run times as compared to the run times for performing multiphase flow production simulation. In addition, the disclosed embodiments decrease the complexity and knowledge needed to provide a comparison of general flow modeling relative to production history for the non-esoteric user.

The disclosed embodiments and additional advantages thereof are best understood by referring to FIG. 1A through FIG. 15 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

Figure 1A:
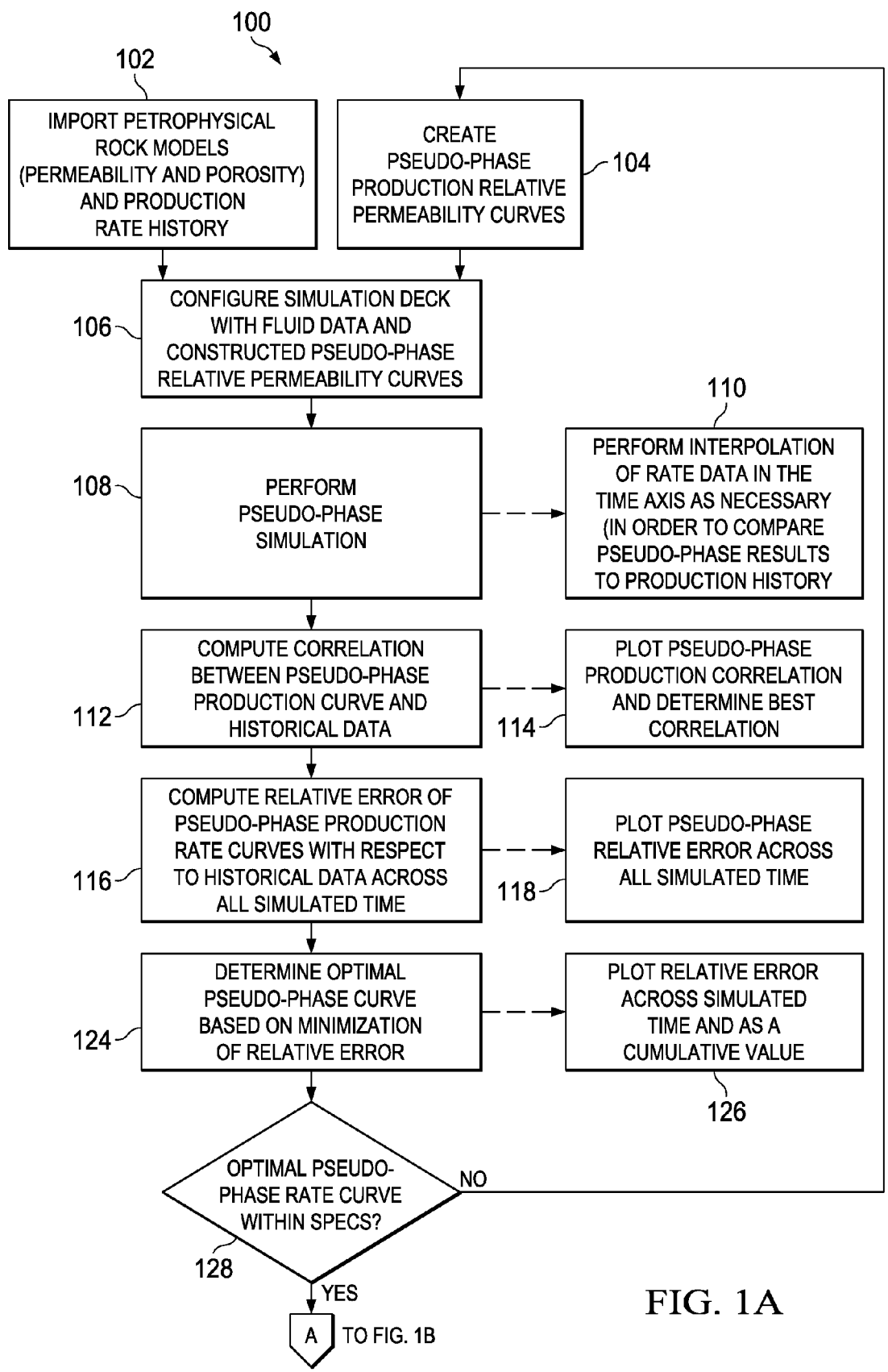
FIGS. 1A-1B is a flowchart that illustrates an example of a process for approximating multiphase flow in accordance with the disclosed embodiments.

Beginning with FIG. 1A, an example of a computer implemented method/process 100 for approximating multiphase flow in accordance with the disclosed embodiments is presented. The process 100 begins at step 102 by importing/receiving one or more petrophysical rock models (also commonly referred to as earth models) and production history data. In one embodiment, the earth models comprise three dimensional (3D) volumes/cells that include assigned values describing the physical and chemical rock properties and their interactions with fluid. For example, in one embodiment, the assigned values include a permeability value and a porosity value associated with the rock type. The earth models may be generated using software such as, but not limited to, DecisionSpace® Earth Modeling software available from Landmark Graphics Corporation. In one embodiment, multiple earth models are cosimulated (i.e., multiple realizations of the earth model is generated with slightly different property values, e.g., porosity and permeability values are different for each realization). In certain embodiments, the process 100 may select a particular realization that is determined to be most accurate based on user-defined parameters and/or based on a comparison of previous production data then proceeds to simulation with the selected realization. In other embodiments, the process 100 may perform simulation on multiple realizations of the earth model.

As stated above, at step 102, the process 100 also receives production history data such as, but not limited to, production rate data. The amount of production history data may vary from several months to several years. In one embodiment, the reservoir production history data represents a time domain feature that is processed as a time dependent signal with components of varying frequency for analyzing the time domain data to determine the existence of flow regimes. Additionally, in some embodiments, the process is configured to identify the componentization of flow behavior according to signal characteristics that exist in the resulting hydrocarbon production.

In addition, at step 104, the process 200 includes creating one or more pseudo-phase production relative permeability ($K_r$) curves that describe fluid-fluid and fluid-rock interaction. Permeability is the ability for fluids to flow in porous media. In multiphase flow, the relative permeability of a phase is a measure of dependent ratio of effective permeability of that phase to absolute permeability with respect to an independent measure of saturation variation that varies with time ($K_r = K_{effective}/K_{absolute}$).

Figure 2:
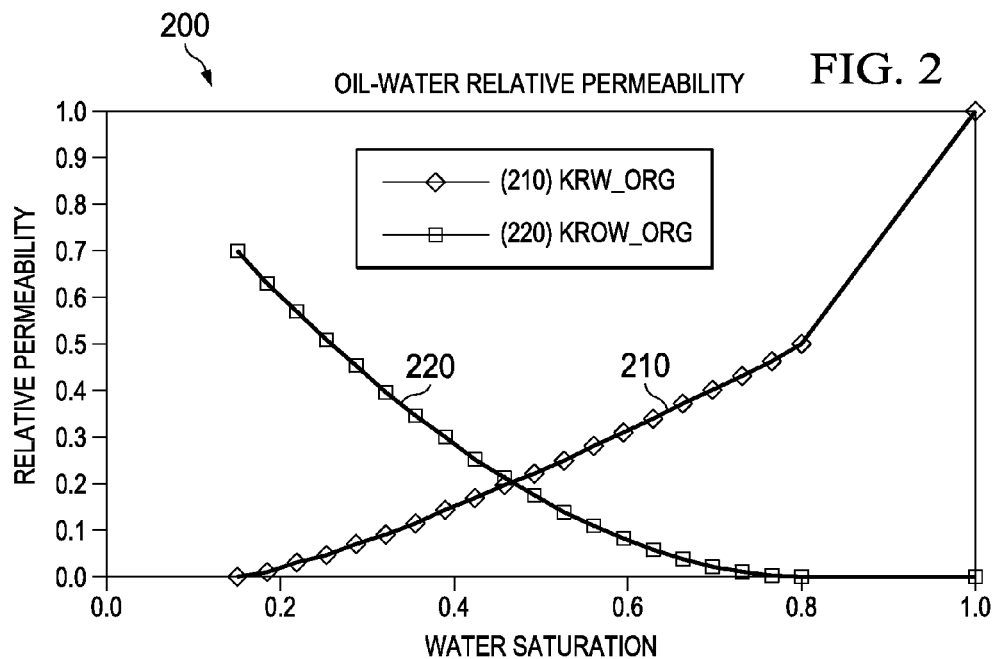
FIG. 2 is a graph that depicts an example of a drainage oil-water relative permeability curve in accordance with the disclosed embodiments.
Figure 3:
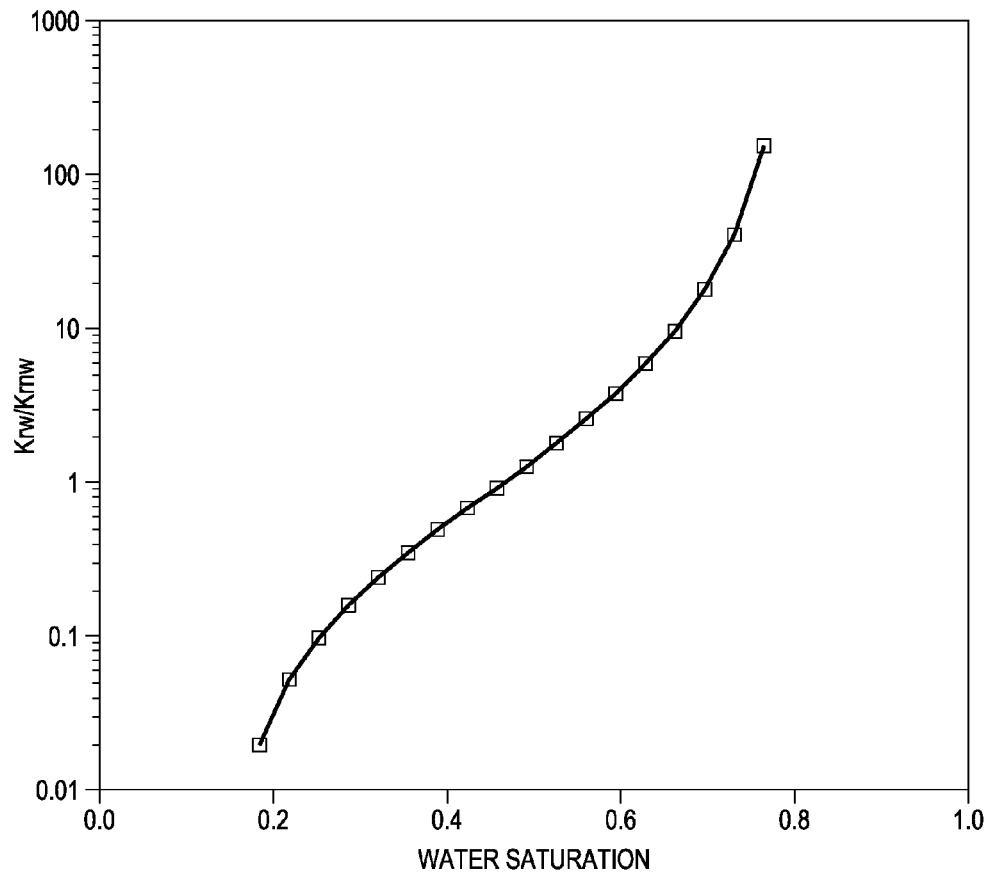
FIG. 3 is a graph that depicts an example of a relative permeability ratio curve in accordance with the disclosed embodiments.

An example of a relative permeability curve 200 is illustrated in FIG. 2. In particular, the relative permeability curve 200 is a drainage oil-water relative permeability curve. While water saturation is expressed as the independent axis, it is in fact a proxy for time. This is demonstrated in the Buckley-Leverett transport equation, which is used to model two-phase flow in porous media. The Buckley-Leverett equation is expressed as:

$$\frac{\partial S}{\partial t} = U(S)\frac{\partial S}{\partial x}$$

where $$U(S) = \frac{Q}{\varphi A}\frac{df}{dS}$$

Here, $S(x, t)$ is the water saturation, f is the fractional flow rate, Q is the total flow, $\varphi$ is porosity and A is the area of the cross-section in the porous media.

The relative permeability curve 200 depicts a drainage two-phase system where a non-wetting fluid (oil) phase displaces a present wetting (water) phase in the porous media. The porous medium is initially saturated with water and then via a displacement process triggered by injection of an oil phase into the porous medium, the water saturation (i.e., the relative volume of water present) decreases as the volume of oil increases. At the terminus of the relative permeability curve 200, water saturation is approximately 0.15 (or 15%), which is referred to as the irreducible water saturation (or Swirl). Thus, relative permeability changes with time due to changes in saturation of one fluid phase relative to another. This relationship may expressed using the following formula:

$$S_w(t) \rightarrow kr_{w,nw}(S_w,t)$$

where '$S_w$' is water saturation, 'kr' is relative permeability, the 'w' subscript refers to wetting fluid phase, the 'nw' subscript refers to non-wetting fluid phase, and 't' is time.

A profile of water saturation with time is typically derivable from the core/plug flooding experiment performed during special core analysis (SCAL or SPCAN) to generate the relative permeability curves. Special core analysis is a laboratory procedure for conducting flow experiments on core plugs taken from a petroleum reservoir. In particular, special core analysis includes measurements of two-phase flow properties, determining relative permeability, and capillary pressure and resistivity index using cores, slabs, sidewalls or plugs of a drilled wellbore. The derived relative permeability and capillary pressure curves act as input into a reservoir simulator to describe multiphase flow in the subsurface porous media and allow the simulation of fluids in the media with the requisite purpose of matching simulation to historical production data and forecasting future production. The process of special core analysis has been known to take upwards of eighteen to twenty-four months and results are not typically guaranteed due to procedural errors/inaccuracies as well as other risks associated with conducting invasive experiments on physical objects (cores, plugs, etc.).

Based on the above limitations associated with performing special core analysis, the disclosed embodiments provide an alternative method for determining a profile of relative permeability for a given rock type in the absence of relative permeability being measured in a core/sidewall/plug (i.e., derived from special core analysis). For instance, the disclosed embodiments propose the use of a novel method, referred herein as pseudo-phase production, to approximate multiphase flow using a single phase flow by sampling disparate instances of relative permeability at determined periods of stable fluid saturation. In particular, in one embodiment, a computer implemented method is disclosed that approximates different instances of relative permeability, for a given saturation, by simulating flow in a staged approach (i.e., flow one phase at a time while inhibiting the motion of the other phase)—hence creating a pseudo-phase simulation. In other words, two fluid phases would exist in the system, but only one fluid phase is in motion at a given instant.

In one embodiment, the disclosed embodiments utilize discrete, non-physical, relative permeability curves to approximate fluid flow using a collection of step-function relative permeability curves (also referred to herein as a pseudo-phase curves). The step-function relative permeability curves represent flow of a single phase in the presence of another immobile fluid phase. The step-function relative permeability curves have abrupt changes in relative permeability at a cross-over point where the mobile fluid becomes immobile and the initially immobile fluid becomes mobile (i.e., location in curve where ratio of relative permeability (krw/krnw) is equal to 1). An example illustration of the relative permeability ratio (krw/krnw) for the curves in FIG. 2 is shown as a semi-logarithmic plot in FIG. 3, where 'w' refers to the water phase, which is wetting, and 'nw' refers to the oil phase which is the non-wetting phase.

Figure 4:
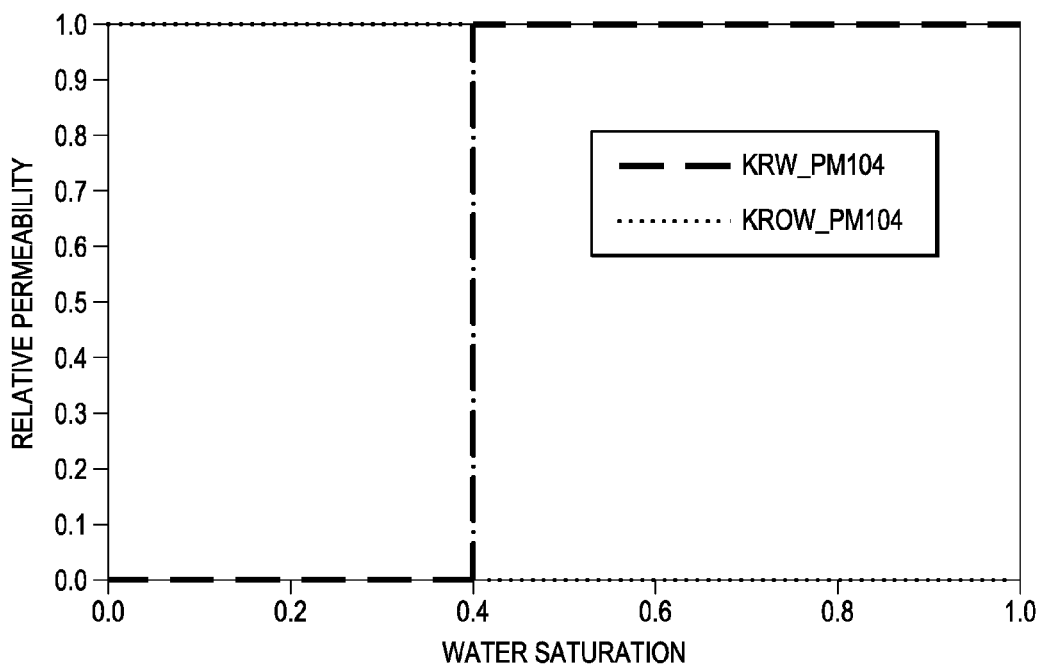
FIG. 4 is a graph that depicts an example of a step-function sampling/pseudo-phase relative permeability curve in accordance with the disclosed embodiments.

In one embodiment, the step-function relative permeability curves are created in the form of an analog flow system. For instance, an example step-function sampling curve/pseudo-phase curve is illustrated in FIG. 4.

Figure 5:
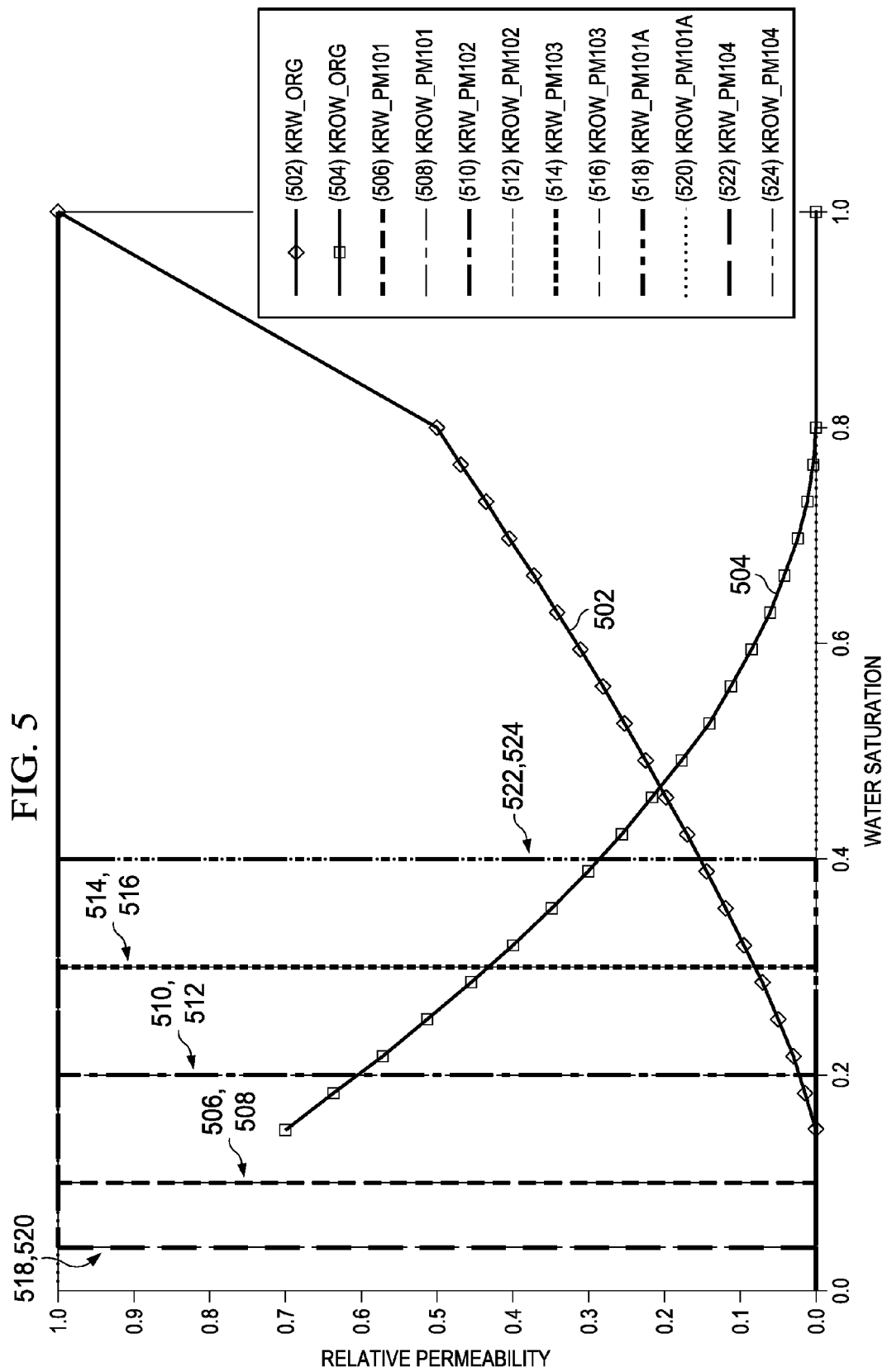
FIG. 5 is a graph that depicts an example of an oil-water relative permeability curve that illustrates an underlying original relative permeability being displayed with several pseudo-phase relative permeability curves that were used in the pseudo-phase simulation to approximate two phase flow through single "pseudo" phases in accordance with the disclosed embodiments.

In some embodiments, multiple step-function relative permeability curves are generated with respective cross-over points occurring at various saturation intervals. The disclosed embodiments then uses the collection of corresponding step-function relative permeability curves, with cross-over locations at varying points along the original relative permeability curve to sample multiphase flow in a water-oil modeled system. For example, FIG. 5 illustrates selected sampling pseudo-phase relative permeability curves (506-524) relative to an original relative permeability curve (502 and 504). In the depicted embodiment, the illustrated pseudo-phase curves were used in the execution of subsequent simulations; whereby each executed simulation uses each of the pseudo-phase curves respectively.

Referring back to FIG. 1, once the pseudo-phase curves are generated, the process, at step 106, imports the pseudo-phase curves as a synthesized signal into a reservoir simulation application, such as, but not limited to, Nexus® Reservoir Simulation software available from Landmark Graphics Corporation, for performing flow simulation. Additionally, the process receives simulation configuration parameters such as, but not limited to, grid properties (e.g., grid cell size and total number of cells simulated), reservoir model type (e.g., oil/water), simulated time period, number of producing wells and water injector wells along with rate and pressure constraints, initial Pressure-Volume-Temperature (PVT) conditions, and phase contact depth.

Figure 6:
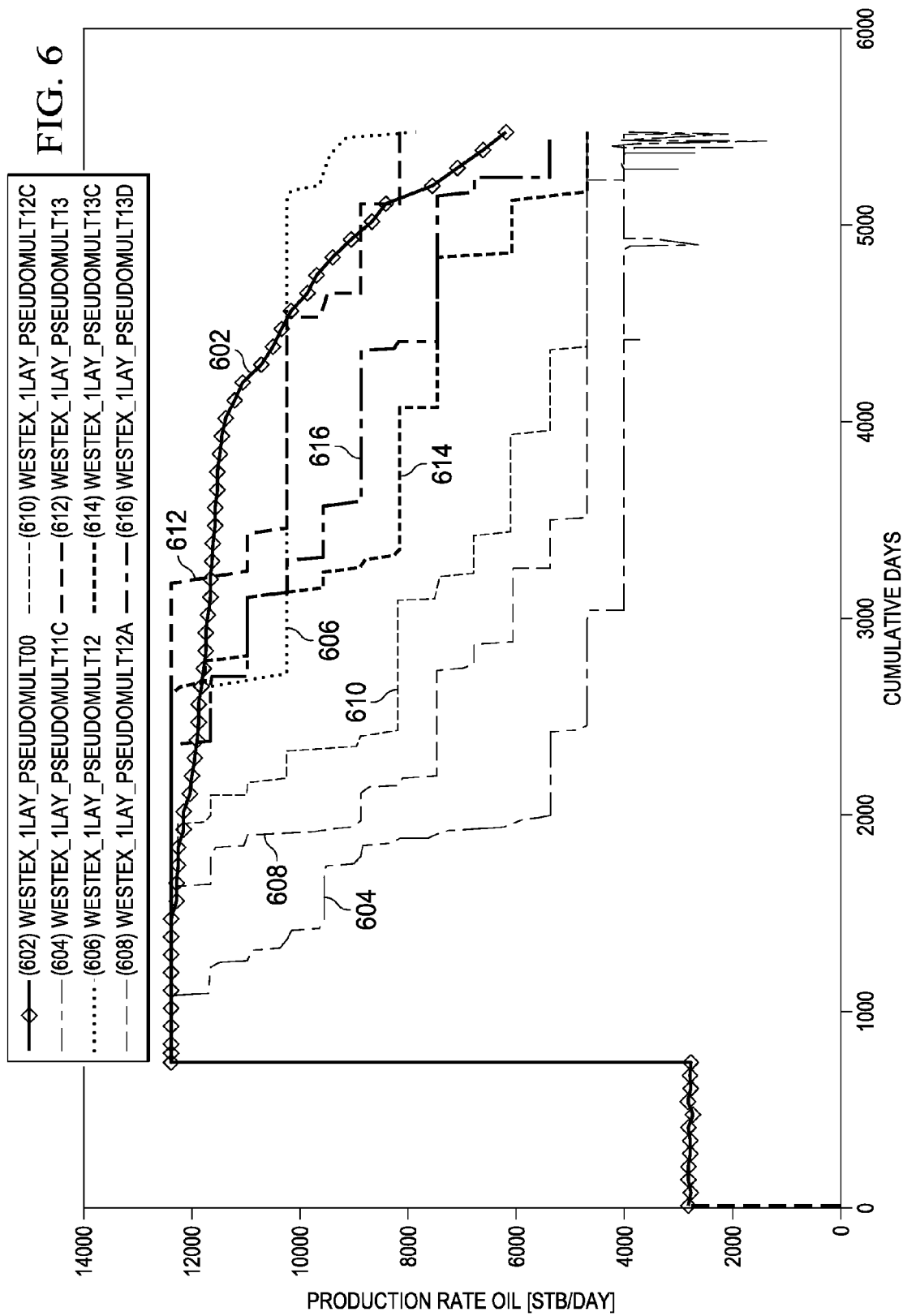
FIG. 6 is a graph that depicts an example of a historical oil production rate curve shown relative to raw (non-interpolated) oil production rate plots resulting from disparate pseudo-phase simulation runs in accordance with the disclosed embodiments.

Once the parameters are configured, the process performs pseudo-phase simulation at step 108. In one embodiment, the process outputs the resulting oil production rate plots from the pseudo-phase models juxtaposed with respect to the historical production. For example, FIG. 6 illustrates the raw oil production rate results from the flow simulations that are construed using KRW_ORG and KRO_ORG from FIG. 2 as the sole input for relative permeability. The historical oil production rate curve 602 is illustrated relative to raw (non-interpolated) oil production rate plots (604-616) resulting from disparate pseudo-phase simulation runs. As depicted in FIG. 6, prior to 1000 days of cumulative simulated time, the modeled reservoir remains in single phase depletion given the equivalence in oil production rate of the original (historical) run with respect to the resulting pseudo-phase generated runs.

In some embodiments, the process at step 110 performs interpolation of rate data in the time axis as necessary in order to compare pseudo-phase results to production history. Interpolation is a method of constructing new data points within the range of a discrete set of known data points so that there is consistency among the results (e.g., result plots can be adjusted to have the same number of data points, same time scale, and measurements at the same points in time). For instance, in contrast to FIG. 6, FIG. 7 shows time interpolated oil production rate plots such that all oil production rate plots have an identical discretization of time. The historical oil production rate curve (702) is depicted relative to time-interpolated oil production rate plots (704-716) resulting from disparate pseudo-phase simulation runs, which are illustrated as separate dotted lines. Similar to FIG. 6, prior to 1000 days of cumulative time the modeled reservoir remains in single phase depletion given the equivalence in oil production rate of the original (historical) run with respect to the resulting pseudo-phase generated runs.

Figure 8:
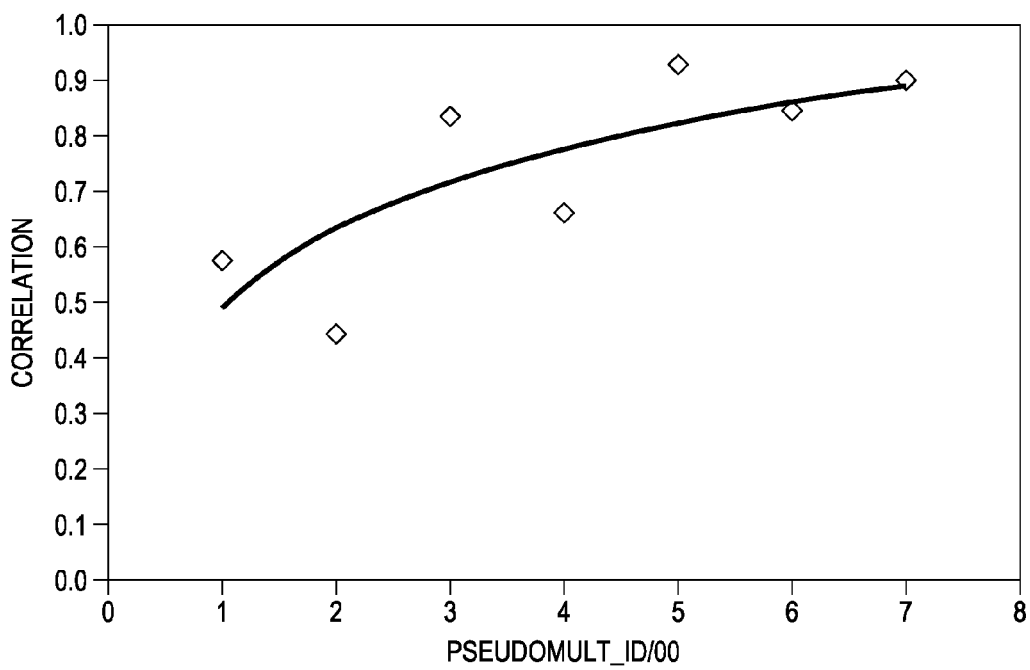
FIG. 8 is a graph that depicts an example of the results of computed correlations of each pseudo-phase production oil rate curve relative to the historical production in accordance with the disclosed embodiments.

In order to assess the relationship of the position of the relative permeability cross-over for each pseudo-phase production relative permeability curves, the process at step 112 computes the correlation coefficient of each pseudo-phase production oil rate curve relative to the historical production. For example, in one embodiment, the process may at step 114 may plot the pseudo-phase production correlation as shown in FIG. 8 to determine the best correlation. In the depicted example, the pseudo-phase relative permeability curve with a cross-over at water saturation of 0.3 (labeled PSEUDOMULT13 in Table 1) has the greatest correlation with the actual relative permeability curve.

TABLE 1

Pseudo-phase production correlation with respect to historical production.

| Pseudo-Phase Production I.D. | Correlation |
| --- | --- |
| PSEUDOMULT12A | 0.5774 |
| PSEUDOMULT11C | 0.4438 |
| PSEUDOMULT12 | 0.6631 |
| PSEUDOMULT13 | 0.9306 |
| PSEUDOMULT13C | 0.8461 |
| PSEUDOMULT13D | 0.8997 |

At step 116, the process then computes the relative error of Pseudo-Phase Production rate curves with respect to historical data across all simulated time to determine the difference between production rates at given instances of time. In certain embodiments, the process, at step 118, may optionally generate a graph 900, as illustrated in FIG. 9, that contrasts the pseudo-phase production curves (904-914) against historical production (902), which has a relative error of "0" at every instance of time with respect to itself, and displayed with a computed minimization function (labeled Min. Function 916). The Min. Function 916 describes the relative error of a construed composite curve derived from honoring a constructed objective function that seeks to minimize the relative error for all instances of simulation time for every implemented pseudo-phase curve. In addition, the Min. Function 916 enables the determination of a best approximation of historical data using the rates of minimum error from individual pseudo-phase production rates.

Figure 10:
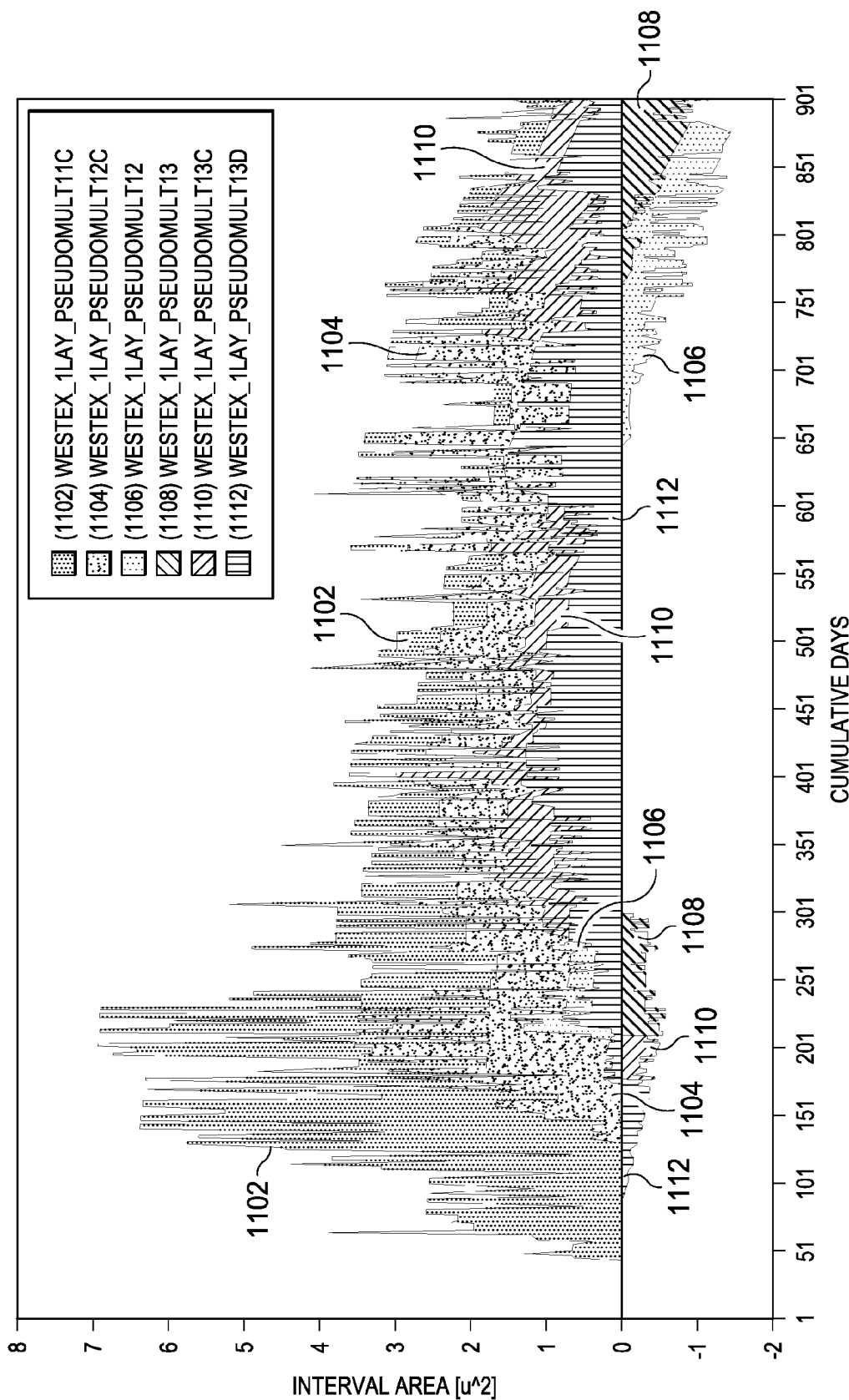
FIG. 10 is a graph that depicts an example of the relative error for varying pseudo-phase production runs computed over simulated time in accordance with the disclosed embodiments.

Additionally, in certain embodiments, the process at step 124 may calculate the area under each curve in FIG. 9 (e.g., using the Trapezoid Rule) to determine the optimal pseudo-phase curve that best approximates historical production by the minimization of error in oil production rate. In one embodiment, the process determines a total error as a singular value to identify the pseudo-phase production curve that has minimum error with respect to the historical production rates. For instance, in some embodiments, the process may at step 126 generate one or more graphs that plot relative error across simulated time and as a cumulative value. For example, FIG. 10 shows the relative error as an error plot for each pseudo-phase curve as a function of time, while FIG. 11 shows the bar graphs for total calculated relative error across simulated time for each pseudo-phase production scenario. As illustrated in FIGS. 10 and 11, in the depicted example, the smallest total error over simulated time is 7.86 square units (occurring in run PSEUDOMULT12), while the second smallest total error is 9.62 square units (occurring in run PSEUDOMULT13).

At step 124, the process determines whether the difference between the optimal pseudo-phase curve with respect to the historical production rates determined in the previous steps (e.g., PSEUDOMULT12 illustrated in FIGS. 10 and 11) is within a user-defined error threshold. In other words, a user may define how large of an error may exist between the determined optimal pseudo-phase curve in comparison to the historical data. For instance, if the error between the optimal pseudo-phase curve and the historical production rates exceeds the user-defined error threshold, then a determination is made that there is no good correlation between the pseudo-phase curves with respect to the historical production rates (i.e., the particular pseudo-phase runs do not approximate any instance of production from the particular reservoir). In one embodiment, if the error between the optimal pseudo-phase curve and the historical production rates exceeds the user-defined error threshold, the process returns to step 104 and creates new pseudo-phase production relative permeability curves and repeats the process 100.

Figure 1B:
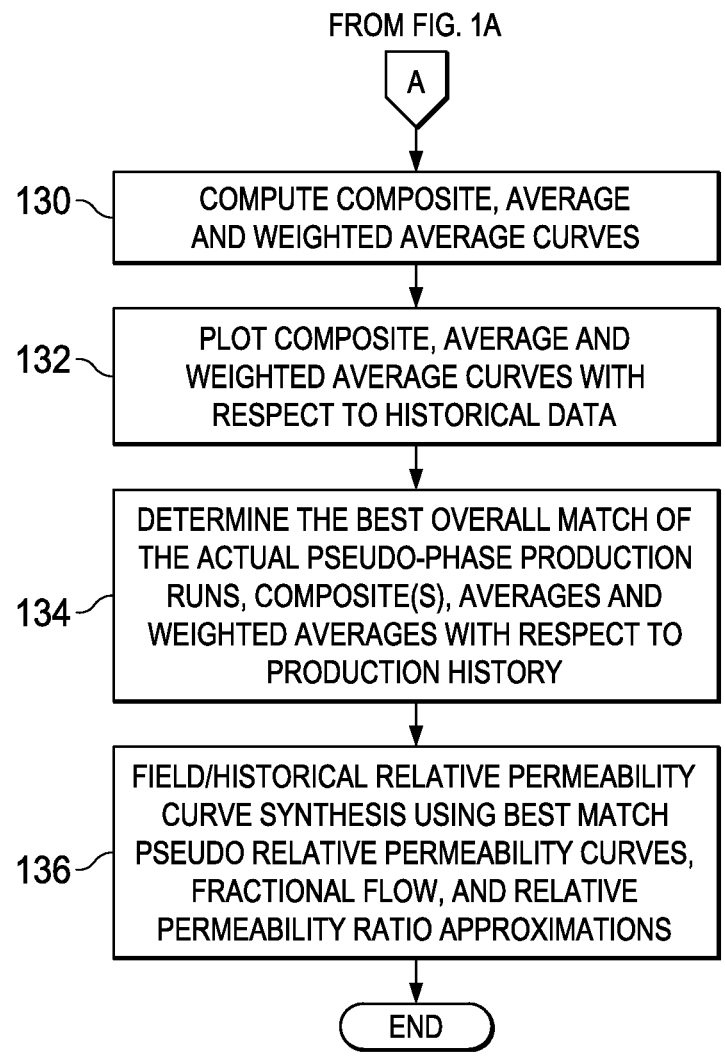

Referring to FIG. 1B, in one embodiment, if the error between the optimal pseudo-phase curve with respect to the historical production rates is within the user-defined error threshold, the process at step 130 computes one or more of a composite, average, and weighted average curves that provide a description of production rate through the union of pseudo-phase relative permeability curves. Additionally, the process may at step 132 generate charts that plot the composite, average, and/or weighted average curves.

Figure 12:
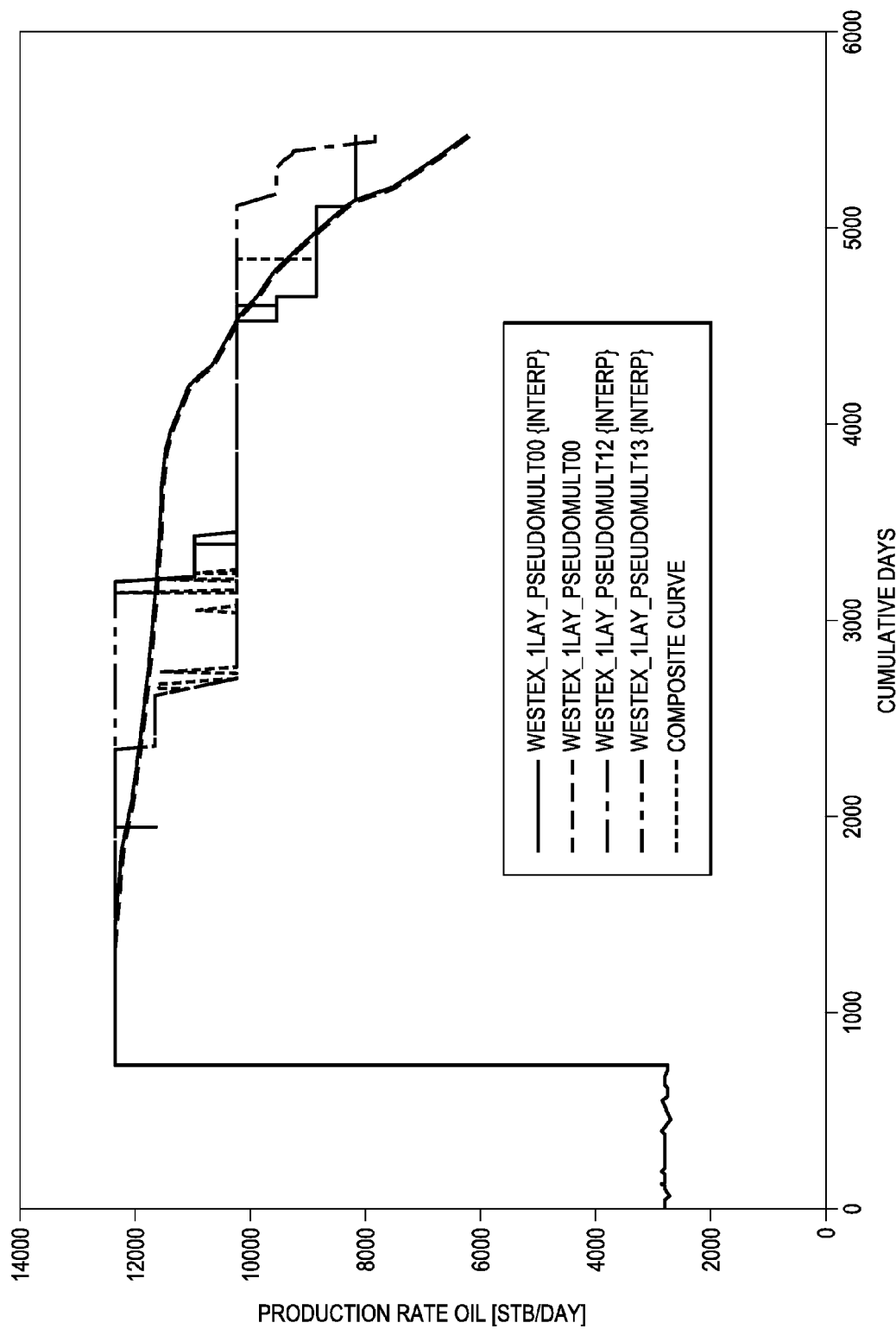
FIG. 12 is a graph that depicts an example of a composite curve juxtaposed with time-interpolated pseudo-phase production rate curves and a historical production rate curve in accordance with the disclosed embodiments.

In one embodiment, the process creates the composite production rate curve by modifying the basis curve, derived from optimizing curve selection based on relative error, and replacing production rates from more suitable instances of hydrocarbon production rates from pseudo production rate profiles that have minimized error with respect to historical production rates. In one embodiment, to create the composite curve, the process will begin by using points along a best matching curve and altering it using points along other curves that have a better match. For instance, FIG. 12 provides an example composite curve illustrated with two disparate pseudo-phase production curves. As depicted in FIG. 12, while spikes in production rate are present the composite curve, it still represents a collectively better match to historical data compared to individual Pseudo-Phase Production rate curves.

Figure 13:
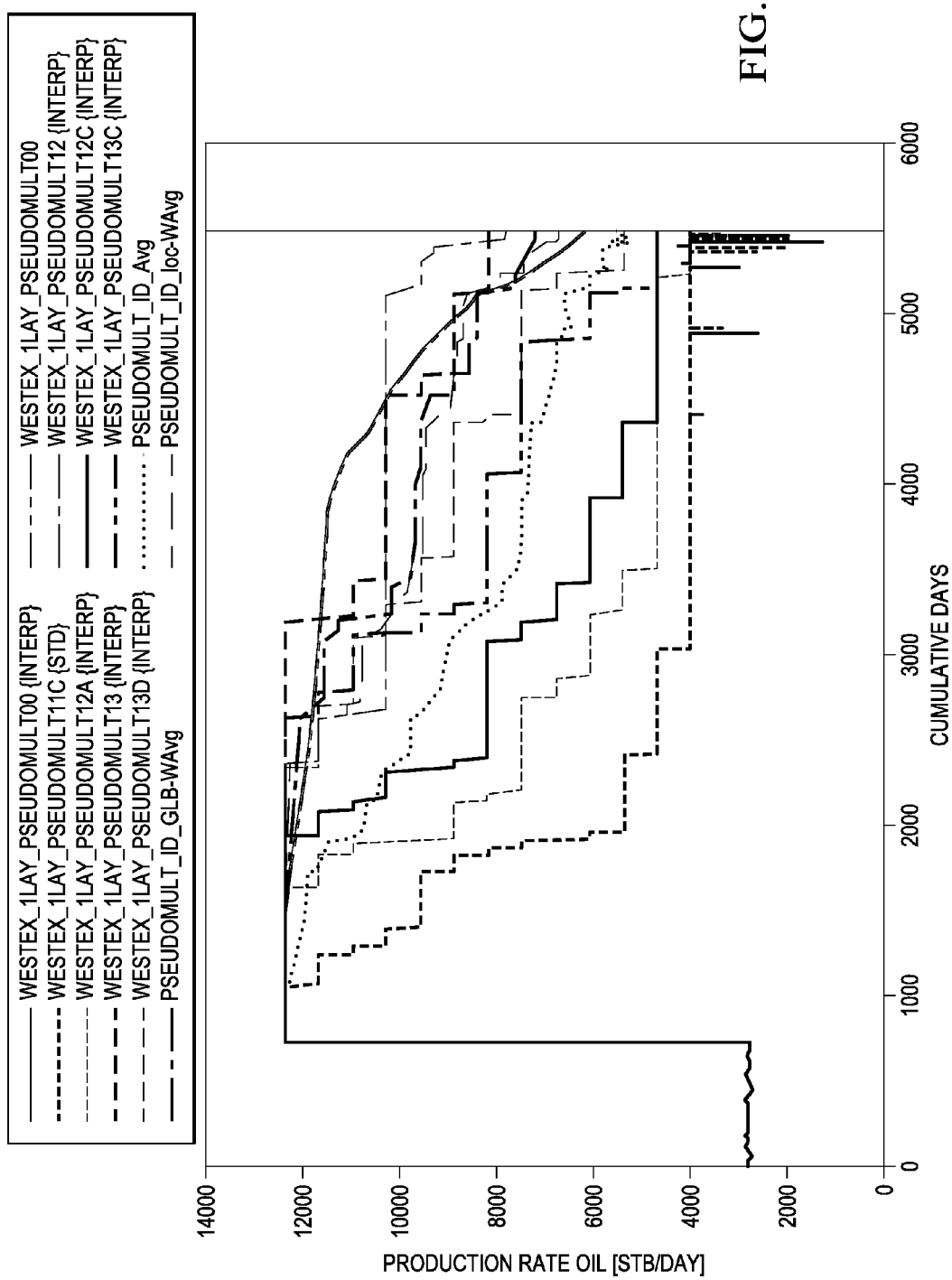
FIG. 13 is a graph that depicts an example of pseudo-phase production time-interpolated rate curves plotted with a variety of averaged pseudo-phase production rate curves derived from numerical and weighted (global and local) averaging techniques in accordance with the disclosed embodiments.

The average pseudo-phase production curve represents the numerical averaging of a range of selected pseudo-phase production rate results across simulated time. In certain embodiments, the process may create the weighted-average production rate curves using global or local methods; both respective methods are implemented by applying a discrete weighting factor to an intrinsic pseudo-phase production rate result before normalization. The global method represents the best approximation of the entire production rate history over time, while the local method represents the best approximation of historical production rate at more discrete time intervals. As an example, all averaging schemes (numerical, global weighted and local weighted) are illustrated in FIG. 13.

At step 134, the process determines the best overall match of the actual pseudo-phase production runs, composite(s), averages and weighted averages with respect to production history. For these particular set of pseudo-phase production runs, as shown in FIG. 13, the global and local weighted average curves possess a better match with respect to historical data than the non-weighted curves.

Once the best pseudo multiphase runs have been identified, the process at step 136 selects the pseudo phase relative permeability curves that correspond to the production rate and cumulative production profiles that yielded simulation results of considerable correlation to historical data for approximating the relative permeability ratio. As stated above, in one embodiment, the step-function relative permeability curves are created in the form of an analog flow system. Due to the analog nature of sampling relative permeability curves, the process cannot simply determine a relative permeability ratio for the step-function relative permeability curves because as previously noted, the step-function curves represent flow of a single phase in the presence of another immobile fluid phase; then at the cross-over point the mobile fluid becomes immobile and the initially immobile fluid becomes mobile; thus, the resulting relative permeability ratio curve would not exist as it would be comprised of '0' and '∞' values. Therefore, in one embodiment, to approximate the relative permeability ratio from available production rates, the process utilizes the following fractional flow equation:

$$ff = \frac{1}{1 + \frac{\mu_o K_{rw}}{\mu_w K_{ro}}} \qquad \text{[Equation 1]}$$

which leads to:

$$\frac{K_{rw}}{K_{ro}} = \frac{\mu_w}{\mu_o}\left(\frac{1}{ff} - 1\right) \qquad \text{[Equation 2]}$$

Whereby "ff" is the fractional flow of a fluid phase relative to another phase that is present in the model, $\mu_{o,\ w}$ is the viscosity of oil and water respectively and $K_{ro,w}$ is the relative permeability of one phase in the presence of a second fluid phase. The subscript "o" and "w" refer to oil and water, respectively, in the defined two phase system.

Because the right hand side of Equation 2 is the known result of the simulation, it may be written as a constant 'C' such that:

$$\frac{K_{rw}}{K_{ro}} = C \quad \text{[Equation 3]}$$

Effective permeability is defined as:

$$K_{\mathit{eff}}^{o,w} = K_{abs} K_{ro,w} \quad \text{[Equation 4]}$$

Where $K_{\mathit{eff}}$ is the effective permeability and $K_{abs}$ is the absolute permeability; $K_{ro,w}$ maintains its definition as stated above. Assuming that an absolute permeability is computed for an arrangement of grid blocks under consideration.

Combining Equation 3 and 4, we then have:

$$K_{\mathit{eff}}^{o,w} = K_{abs} C K_{rw,o} \quad \text{[Equation 5]}$$

where the effective permeability of one fluid phase is a function of relative permeability to the other respective fluid phase—i.e. note the 'o,w' and 'w,o' indices change in Equation 5. Thus, because fractional flow and relative permeability are normalized numerical values and effective permeability has an upper bound of the absolute permeability of the porous media, a collection of effective and relative permeability exist, as a corollary, that indicate a range of possible relative permeability values defined for a steady state pseudo phase production solution.

Figure 14A:
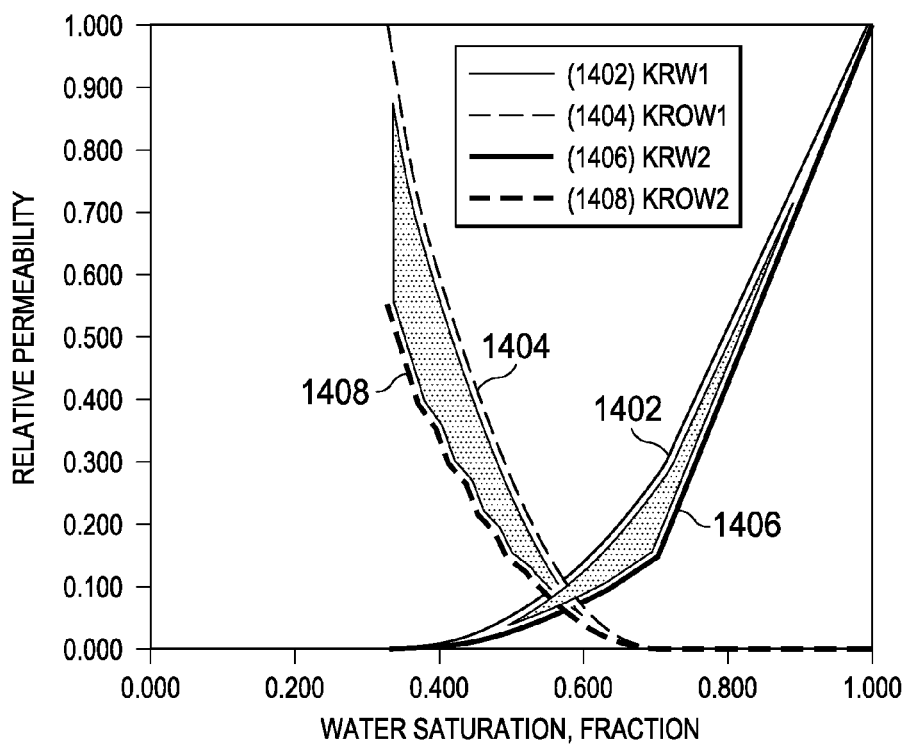
FIG. 14A is a graph that depicts an example of a relative permeability uncertainty curve in accordance with the disclosed embodiments.
Figure 14B:
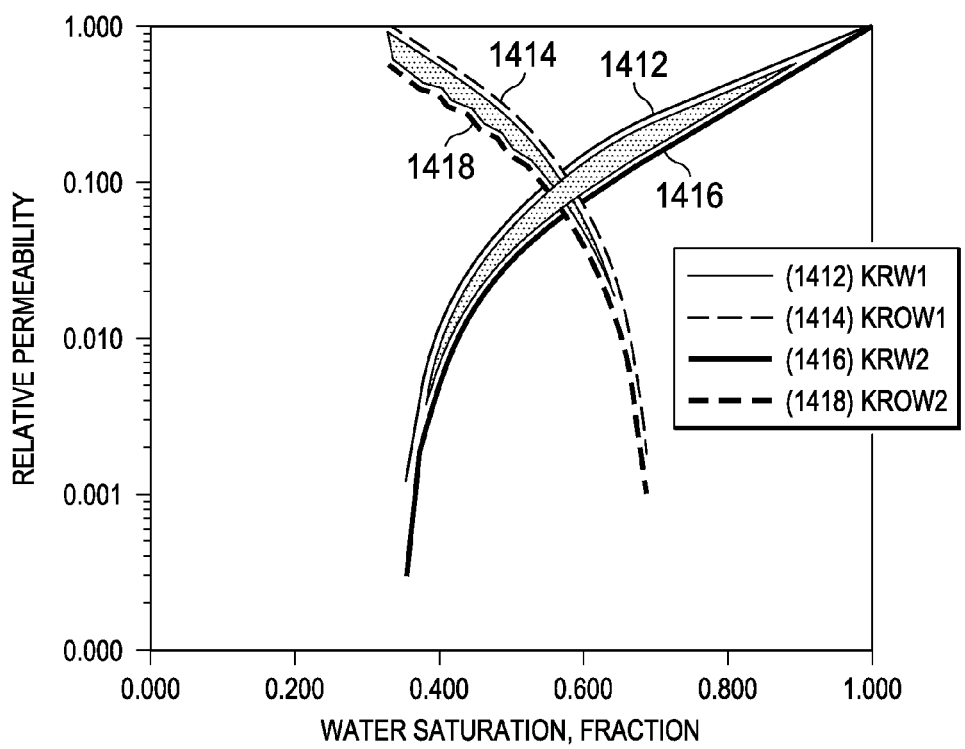
FIG. 14B is a graph that depicts an example of a relative permeability uncertainty curve plotted in semi-logarithmic coordinates in accordance with the disclosed embodiments.

As a result, a relative permeability uncertainty curve may be devised to approximate subsurface description of relative permeability in the absence of a measured relative permeability curve derived from special core analysis being used in the parameterization of the executed reservoir simulation. The bounded relative permeability curves with quantified uncertainty are then created as a function of fluid saturation and relative permeability—as per Equation 5. This may provide an indication of rock-fluid interaction in the porous media through consideration of production history in the absence of the true descriptions of rock-fluid interaction measured in the in-situ porous media. For instance, FIG. 14A illustrates an example of a relative permeability uncertainty curve plotted in Cartesian coordinates. In the depicted embodiment, the shaded areas represent the quantified zones of uncertainty in the relative permeability curves derived from relative permeability inversion using pseudo-phase production analysis. Similarly, FIG. 14B illustrates an example of a relative permeability uncertainty curve plotted in in semi-logarithmic coordinates. Again, the shaded areas represent the quantified zones of uncertainty in the relative permeability curves derived from relative permeability inversion using pseudo-phase production analysis.

Accordingly, the disclosed embodiments provide an alternative method for performing multiphase flow simulation that uses one or more pseudo-phase single flow relative permeability curves as a proxy for approximating multiphase flow simulation. As can be seen from the above process, the disclosed embodiments provided at least one pseudo-phase production rate result that sufficiently matched historical production data. Additionally, the disclosed embodiments may deriving a composite rate curve that matched production rate to historical rate data at specific time intervals and may also include deriving average rate curves (numerical, globally weighted and locally weighted) that matched production rate to historical data that are less apt to contain spikes in rate due to numerical smoothing associated with averaging data. Further, the disclosed embodiments include performing a relative permeability inversion method using viscosity ratio invariant step-function Pseudo-Phase simulation of production data to approximate the system description of relative permeability and provide a quantitative assessment of uncertainty in the determination of subsurface production system relative permeability. The relative permeability curves derived from this novel workflow may subsequently be used as input into a reservoir simulation engineering workflow as a description of rock-fluid interaction and allow workflow progression into a classical history matching process whereby software such as Landmark's Nexus® reservoir simulator or another numerical reservoir simulator may be used to execute numerical flow simulation.

Figure 15:
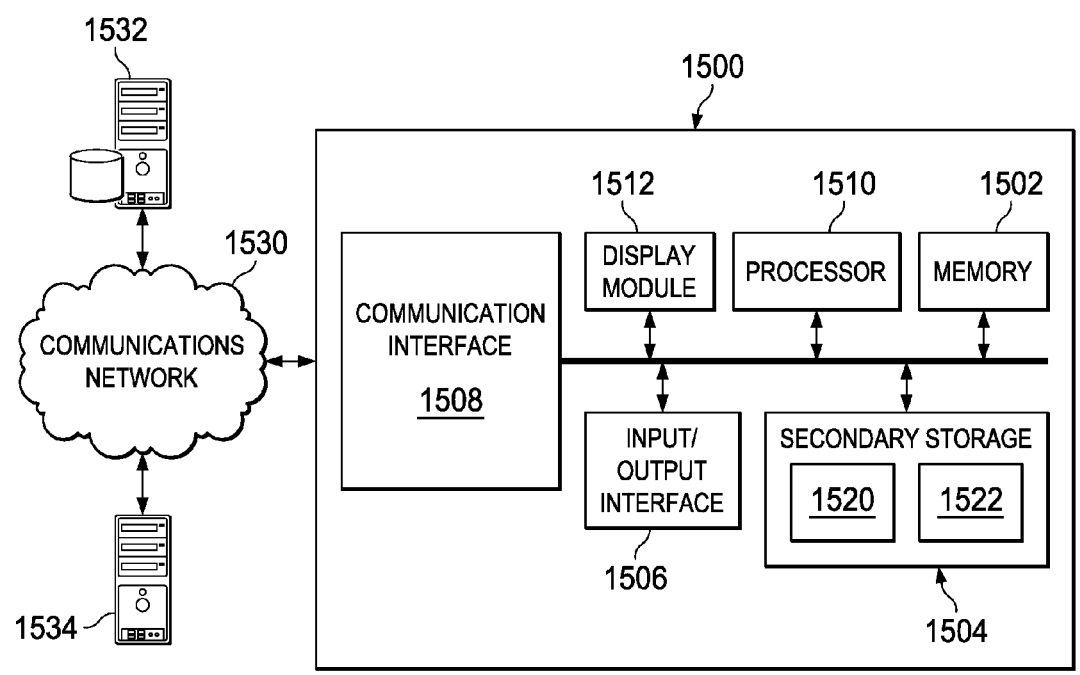
FIG. 15 is a block diagram illustrating one embodiment of a system for implementing the disclosed embodiments.

With reference to FIG. 15, a block diagram illustrating one embodiment of a system 1500 for implementing the features and functions of the disclosed embodiments is presented. The system 1500 includes, among other components, a processor 1510, main memory 1502, secondary storage unit 1504, an input/output interface module 1506, and a communication interface module 1508. The processor 1510 may be any type or any number of single core or multi-core processors capable of executing instructions for performing the features and functions of the disclosed embodiments.

The input/output interface module 1506 enables the system 1500 to receive user input (e.g., from a keyboard and mouse) and output information to one or more devices such as, but not limited to, printers, external data storage devices, and audio speakers. The system 1500 may optionally include a separate display module 1512 to enable information to be displayed on an integrated or external display device. For instance, the display module 1512 may include instructions or hardware (e.g., a graphics card or chip) for providing enhanced graphics, touchscreen, and/or multi-touch functionalities associated with one or more display devices. For example, in one embodiment, the display module 1512 is a NVIDIA® QuadroFX type graphics card that enables viewing and manipulating of three-dimensional objects.

Main memory 1502 is volatile memory that stores currently executing instructions/data or instructions/data that are prefetched for execution. The secondary storage unit 1504 is non-volatile memory for storing persistent data. The secondary storage unit 1504 may be or include any type of data storage component such as a hard drive, a flash drive, or a memory card. In one embodiment, the secondary storage unit 1504 stores the computer executable code/instructions and other relevant data for enabling a user to perform the features and functions of the disclosed embodiments.

For example, in accordance with the disclosed embodiments, the secondary storage unit 1504 may permanently store the executable code/instructions of an algorithm 1520 for approximating multiphase flow reservoir production simulation as described above. The instructions associated with the algorithm 1520 are then loaded from the secondary storage unit 1504 to main memory 1502 during execution by the processor 1510 for performing the disclosed embodiments. In addition, the secondary storage unit 1504 may store other executable code/instructions and data 1522 such as, but not limited to, a reservoir simulation application for use with the disclosed embodiments.

The communication interface module 1508 enables the system 1500 to communicate with the communications network 1530. For example, the network interface module 1508 may include a network interface card and/or a wireless transceiver for enabling the system 1500 to send and receive data through the communications network 1530 and/or directly with other devices.

The communications network 1530 may be any type of network including a combination of one or more of the following networks: a wide area network, a local area network, one or more private networks, the Internet, a telephone network such as the public switched telephone network (PSTN), one or more cellular networks, and wireless data networks. The communications network 1530 may include a plurality of network nodes (not depicted) such as routers, network access points/gateways, switches, DNS servers, proxy servers, and other network nodes for assisting in routing of data/communications between devices.

For example, in one embodiment, the system 1500 may interact with one or more servers 1530 or databases 1532 for performing the features of the present invention. For instance, the system 1500 may query the database 1532 for well log information in accordance with the disclosed embodiments. In one embodiment, the database 1532 may utilize OpenWorks® software available from Landmark Graphics Corporation to effectively manage, access, and analyze a broad range of oilfield project data in a single database. Further, in certain embodiments, the system 1500 may act as a server system for one or more client devices or a peer system for peer to peer communications or parallel processing with one or more devices/computing systems (e.g., clusters, grids).

While specific details about the above embodiments have been described, the above hardware and software descriptions are intended merely as example embodiments and are not intended to limit the structure or implementation of the disclosed embodiments. For instance, although many other internal components of the system 1500 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media (i.e., a computer program product) include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions, instructions, or code noted in a block diagram or illustrated pseudocode may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Accordingly, the disclosed embodiments provide a system, computer program product, and method for approximating multiphase flow reservoir production simulation using a single pseudo-phase flow. In addition to the embodiments described above, many examples of specific combinations are within the scope of the disclosure, some of which are detailed below.

One example is a computer-implemented method, system, or a non-transitory computer readable medium for approximating multiphase flow reservoir production simulation, that implements instructions comprising: generating a set of pseudo-phase production relative permeability curves; receiving production rate history data; receiving limited simulation configuration parameters (excluding measured relative permeability curves derived from special core analysis); performing flow simulation using the set of pseudo-phase production relative permeability curves; determining an optimal matching pseudo-phase production simulation result that best matches the production rate history data; and performing relative permeability inversion using signal processing analysis of production rate history data to approximate a relative permeability curves with quantified uncertainty.

In certain embodiments, in determining an optimal matching pseudo-phase production simulation result that best matches the production rate history data, the computer-implemented method, system, or non-transitory computer readable medium includes or implements instructions that performs at least one of computing a correlation coefficient for each pseudo-phase production simulation result relative to the production rate history data, and computing a relative error for each pseudo-phase production simulation result relative to the production rate history data across all simulated time to determine a difference between production rate at given instances of time for each pseudo-phase production simulation result. In addition, in certain embodiments, the computer-implemented method, system, or non-transitory computer readable medium includes or implements instructions that generates at least one of a composite, average, and weighted average curve that provides a description of production rate through a union of pseudo-phase relative permeability curves.

The above specific example embodiments are not intended to limit the scope of the claims. For instance, the example embodiments may be modified by including, excluding, or combining one or more features, steps, instructions, or functions described in the given example or in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to explain the principles of the invention and the practical application, and to enable others of ordinary skill in the art to understand the invention for various embodiments with various modifications as are suited to the particular use contemplated. The scope of the claims is intended to broadly cover the disclosed embodiments and any such modification.

The invention claimed is:

1. A computer-implemented method for approximating multiphase flow reservoir production simulation, the method comprising:
   generating, by a computer system, a set of pseudo-phase production relative permeability curves representing a single phase of a multiphase fluid flow through a subsurface porous medium;
   receiving, by the computer system, production rate history data;
   receiving simulation configuration parameters;
   performing, by the computer system, flow simulation using each pseudo-phase production relative permeability curve in the set of pseudo-phase production relative permeability curves and the simulation configuration parameters;
   determining, by the computer system, an optimal matching pseudo-phase production simulation result that best matches the production rate history data by:
      interpolating pseudo-phase production rate data resulting from the flow simulation for each pseudo-phase production relative permeability curve;
      comparing the interpolated pseudo-phase production rate data for each pseudo-phase production relative permeability curve to the production rate history data; and
      selecting at least one of the pseudo-phase production relative permeability curves as the optimal matching pseudo-phase production simulation result, based on the comparison; and
   performing relative permeability inversion using pseudo-phase production analysis to approximate relative permeability curves describing hydraulic conductivity for the multiphase fluid flow through the subsurface porous medium, based on the optimal matching pseudo-phase production simulation result.

2. The computer-implemented method of claim 1, wherein determining an optimal matching pseudo-phase production simulation result that best matches the production rate history data includes computing a correlation coefficient for each pseudo-phase production simulation result relative to the production rate history data.

3. The computer-implemented method of claim 1, wherein determining an optimal matching pseudo-phase production simulation result that best matches the production rate history data includes computing a relative error for each pseudo-phase production simulation result relative to the production rate history data across all simulated time to determine a difference between production rate at given instances of time.

4. The computer-implemented method of claim 1, wherein the set of pseudo-phase production relative permeability curves is a set of step-function relative permeability curves that represent flow of the single phase in the presence of another immobile fluid phase.

5. The computer-implemented method of claim 4, wherein the set of step-function relative permeability curves has cross-over locations at varying points along an original relative permeability curve.

6. The computer-implemented method of claim 1, wherein receiving simulation configuration parameters includes importing at least one petrophysical rock model.

7. The computer-implemented method of claim 1, wherein determining an optimal matching pseudo-phase production simulation result that best matches the production rate history data includes generating at least one of a composite, average, and weighted average curve that provides a description of production rate through a union of pseudo-phase relative permeability curves; and determining whether the at least one of a composite, average, and weighted average curve provides the optimal matching pseudo-phase production simulation result.

8. The computer-implemented method of claim 7, wherein the weighted average curve is a global weighted average curve that applies a discrete weighting factor that provides a representation of a best approximation of an entire production rate history over time.

9. The computer-implemented method of claim 7, wherein the weighted average curve is a local weighted average curve that applies a discrete weighting factor that provides a representation of a best approximation of historical production rate at discrete time intervals.

10. A system, comprising:
    at least one processor; and
    at least one memory coupled to the at least one processor and storing computer executable instructions for approximating multiphase flow reservoir production simulation, which, when executed by the at least one processor, cause the at least one processor to perform operations comprising:
    generating a set of pseudo-phase production relative permeability curves representing a single phase of a multiphase fluid flow within subsurface porous media;
    receiving production rate history data;
    receiving simulation configuration parameters;
    performing flow simulation using each pseudo-phase production relative permeability curve in the set of pseudo-phase production relative permeability curves and the simulation configuration parameters;
    determining an optimal matching pseudo-phase production simulation result that best matches the production rate history data by:
       interpolating pseudo-phase production rate data resulting from the flow simulation for each pseudo-phase production relative permeability curve;
       comparing the interpolated pseudo-phase production rate data for each pseudo-phase production relative permeability curve to the production rate history data; and
       selecting at least one of the pseudo-phase production relative permeability curves as the optimal matching pseudo-phase production simulation result, based on the comparison; and
    performing relative permeability inversion using pseudo-phase production analysis to approximate relative permeability curves describing hydraulic conductivity for the multiphase fluid flow through the subsurface porous medium, based on the optimal matching pseudo-phase production simulation result.

11. The system of claim 10, wherein the instructions for determining an optimal matching pseudo-phase production simulation result that best matches the production rate history data includes computing a correlation coefficient for each pseudo-phase production simulation result relative to the production rate history data.

12. The system of claim 10, wherein the instructions for determining an optimal matching pseudo-phase production simulation result that best matches the production rate history data includes computing a relative error for each pseudo-phase production simulation result relative to the production rate history data across all simulated time to determine a difference between production rate at given instances of time.

13. The system of claim 10, wherein the set of pseudo-phase production relative permeability curves is a set of step-function relative permeability curves that represent flow of the single phase in the presence of another immobile fluid phase, the set of step-function relative permeability curves having cross-over locations at varying points along an original relative permeability curve.

14. The system of claim 10, wherein the instructions for determining an optimal matching pseudo-phase production simulation result that best matches the production rate history data includes generating at least one of a composite, average, and weighted average curve that provides a description of production rate through a union of pseudo-phase relative permeability curves; and determining whether the at least one of a composite, average, and weighted average curve provides the optimal matching pseudo-phase production simulation result.

15. The system of claim 10, wherein determining an optimal matching pseudo-phase production simulation result that best matches the production rate history data includes generating at least one of a composite, average, and weighted average curve that provides a description of production rate through a union of pseudo-phase relative permeability curves; and determining whether the at least one of a composite, average, and weighted average curve provides the optimal matching pseudo-phase production simulation result.

16. The system of claim 15, wherein the weighted average curve is a global weighted average curve that applies a discrete weighting factor that provides a representation of a best approximation of an entire production rate history over time.

17. A non-transitory computer readable medium comprising computer executable instructions for approximating multiphase flow reservoir production simulation, which, when executed by one or more computers, cause the one or more computers to perform operations comprising:
generating a set of pseudo-phase production relative permeability curves representing a single phase of a multiphase fluid flow within subsurface porous media;
receiving production rate history data;
receiving simulation configuration parameters;
performing flow simulation using each pseudo-phase production relative permeability curve in the set of pseudo-phase production relative permeability curves and the simulation configuration parameters;
determining an optimal matching pseudo-phase production simulation result that best matches the production rate history data by:
interpolating pseudo-phase production rate data resulting from the flow simulation for each pseudo-phase production relative permeability curve;
comparing the interpolated pseudo-phase production rate data for each pseudo-phase production relative permeability curve to the production rate history data; and
selecting at least one of the pseudo-phase production relative permeability curves as the optimal matching pseudo-phase production simulation result, based on the comparison; and
performing relative permeability inversion using pseudo-phase production analysis to approximate relative permeability curves describing hydraulic conductivity for the multiphase fluid flow through the subsurface porous medium, based on the optimal matching pseudo-phase production simulation result.

18. The non-transitory computer readable medium of claim 17, wherein the computer executable instructions when executed further causes one or more machines to perform operations comprising computing a correlation coefficient for each pseudo-phase production simulation result relative to the production rate history data.

19. The non-transitory computer readable medium of claim 17, wherein the computer executable instructions when executed further causes one or more machines to perform operations comprising computing a relative error for each pseudo-phase production simulation result relative to the production rate history data across all simulated time to determine a difference between production rate at given instances of time.

20. The non-transitory computer readable medium of claim 17, wherein the computer executable instructions when executed further causes one or more machines to perform operations comprising generating at least one of a composite, average, and weighted average curve that provides a description of production rate through a union of pseudo-phase relative permeability curves; and determining whether the at least one of a composite, average, and weighted average curve provides the optimal matching pseudo-phase production simulation result.

* * * * *